United States Patent [19]

Thomas et al.

[11] 4,380,769
[45] Apr. 19, 1983

[54] ELEMENT FOR RECORDING BY THERMAL DEFORMATION

[75] Inventors: Harold T. Thomas; Joseph J. Wrobel, both of Rochester, N.Y.

[73] Assignee: Eastman Kodak Company, Rochester, N.Y.

[21] Appl. No.: 184,554

[22] Filed: Sep. 5, 1980

Related U.S. Application Data

[63] Continuation of Ser. No. 23,434, Mar. 23, 1979, abandoned, which is a continuation-in-part of Ser. No. 862,069, Dec. 19, 1977, abandoned.

[51] Int. Cl.$^3$ .............................................. G01D 15/34
[52] U.S. Cl. ............................. 346/135.1; 346/76 L; 430/945
[58] Field of Search ............... 346/76 L, 135.1, 77 E; 430/945, 964, 19, 346, 348; 369/284, 288

[56] References Cited

U.S. PATENT DOCUMENTS

| | | | |
|---|---|---|---|
| 3,113,179 | 12/1963 | Glenn . | |
| 3,196,010 | 7/1965 | Goffe | 430/50 |
| 3,262,122 | 7/1966 | Fleisher . | |
| 3,448,458 | 6/1969 | Carlson | 346/76 L X |
| 3,465,352 | 9/1969 | Carlson | 346/76 L |
| 3,475,760 | 10/1969 | Carlson | 346/76 L X |
| 3,549,733 | 12/1970 | Caddell | 430/396 X |
| 3,656,175 | 4/1972 | Carlson | 346/76 L X |
| 3,745,586 | 7/1971 | Braudy | 346/76 L X |
| 3,875,024 | 4/1975 | Picquendar | 430/346 X |
| 3,893,129 | 7/1975 | Endo | 346/76 L X |
| 3,931,460 | 1/1976 | Watson | 346/137 X |
| 4,023,185 | 5/1977 | Bloom | 346/135.1 |
| 4,032,691 | 6/1977 | Kido | 346/76 L X |
| 4,069,487 | 1/1978 | Kasai | 346/76 L |
| 4,090,031 | 5/1978 | Russell | 369/108 X |
| 4,093,684 | 6/1978 | Parts | 346/76 L X |
| 4,097,895 | 6/1978 | Spong | 346/76 L X |
| 4,139,853 | 2/1979 | Ghiekiere | 346/76 L X |
| 4,158,715 | 6/1979 | Smith | 346/76 L X |

FOREIGN PATENT DOCUMENTS

46-24556  7/1971  Japan .............................. 346/135.1

OTHER PUBLICATIONS

Broadbent, K. D., A Review of the MCA Disco-Vision System; Journal of the SMPTE; vol. 83, Jul., 1974; pp. 554-559.

Carlson, et al., Some Considerations in the Design of a Laser Thermal Microimage Recorder; Wescon Technical Papers, vol. 12, 1968, pp. 1-8.

Congleton, et al., A Comparison of Plastic vs. Metal Coatings for Real Time Laser Recording; JAPE, vol. 3, No. 2, Spring 1977, pp. 97-105.

Primary Examiner—Joseph W. Hartary
Attorney, Agent, or Firm—John R. Everett

[57] ABSTRACT

A recording element is disclosed which is capable of providing high-quality, high information-density recording by thermal deformation. The element comprises a support having thereon a layer of amorphous material. The amorphous material is capable of being thermally deformed to form depressions surrounded by sharply defined ridges when impinged upon by a high energy-density recording beam. The amorphous material comprises either a binder and a dye or a certain solvent-coatable dye, Iosol Red. The amorphous material must have an absorption factor, as herein defined, greater than 20. The depressions which are formed in the described material are such that they are readable by a reading beam which is not absorbed by the material.

30 Claims, 3 Drawing Figures

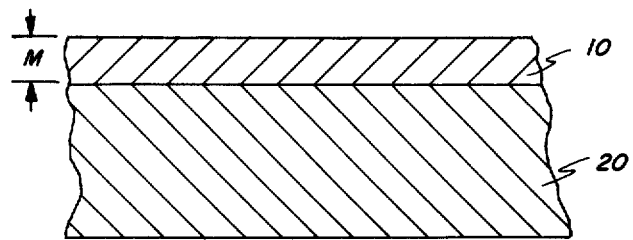
FIG. 1
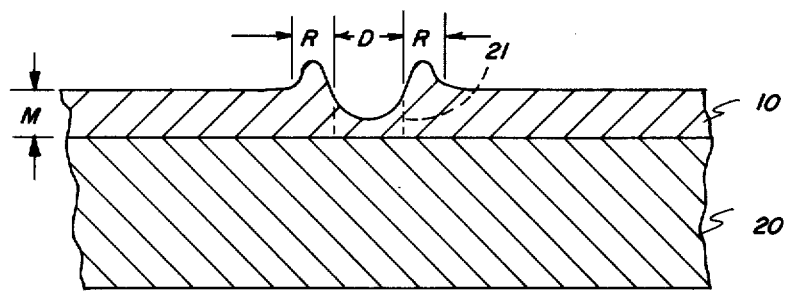
FIG. 2
FIG. 3
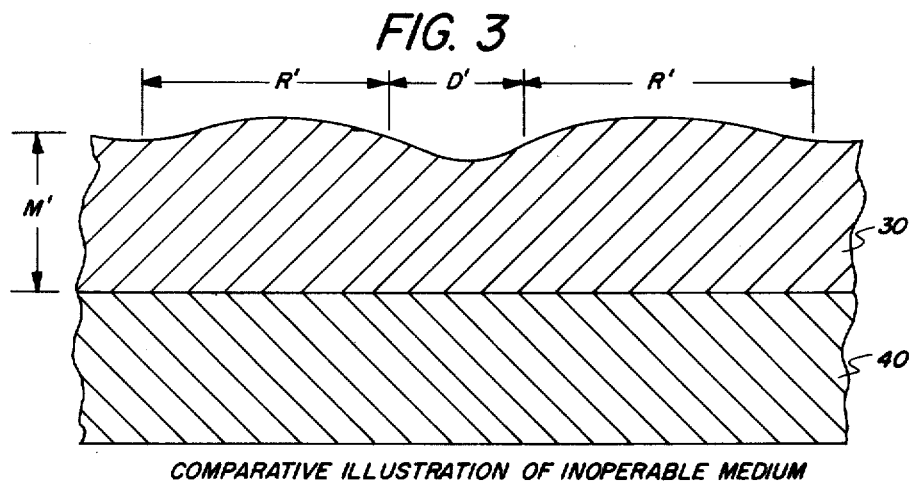
COMPARATIVE ILLUSTRATION OF INOPERABLE MEDIUM

ELEMENT FOR RECORDING BY THERMAL DEFORMATION

CROSS-REFERENCE TO RELATED APPLICATIONS

This is a continuation of our earlier filed application Ser. No. 23,434 filed on Mar. 23, 1979 now abandoned, which in turn is a continuation-in-part of our earlier filed application Ser. No. 862,069 filed Dec. 19, 1977, now abandoned.

BACKGROUND OF THE INVENTION

1. Field of the Invention

This invention relates generally to an element useful for recording information. More particularly, the invention provides an element having a layer capable of being thermally deformed, during recording, in such a way that deformations occur at a high packing density; i.e., a large amount of information is recorded per unit area of the layer, and yet this information is capable of being read out with a high signal-to-noise ratio and few imperfections or dropouts. The element is therefore useful for the recording of video information. In another aspect, the invention relates to a method for writing and reading information on the element of the invention.

2. Description Relative to the Prior Art

Elements for recording information by thermally altering the physical structure of a material are known. U.S. Pat. No. 3,475,760 describes an element for recording information as a thermal deformation pattern. The element comprises a layer of a solvent-coated thermoplastic material on a support. The patent teaches that some thermoplastic materials, modified to have "high" absorption at the wavelength of a recording laser beam, are thermally deformed by that laser beam so that some of the thermoplastic material is displaced from the area illuminated by the beam and forms ridges along the edges of such area. This deformation pattern retains its shape after the laser beam is "removed", and thus it is possible to read the deformation pattern by projecting the pattern onto a viewing screen as a Schlieren image and viewing the image through Schlieren optics.

Similar disclosures are found in Belgian Pat. No. 858,636 and Japanese Patent Publication No. 24556/1971.

None of these patents or publications, however, teaches or suggests materials which are useful in forming a recording element with high-quality, high information-density recording capabilities. More specifically, this prior art does not suggest materials which are capable of being thermally deformed by a laser beam to provide an information record, wherein each discrete bit of recorded information is a deformation having a size less than 1.5 microns (measurement of deformation size is discussed below), and wherein such information is read back with a signal-to-noise ratio greater than or equal to 40 decibels. Such a recording element is very desirable at it allows one, for example, to manufacture inexpensively a 110-mm circular disc which is useful in recording at least one half hour of real-time video programming per disc side.

Newer developments, such as those disclosed in U.S. Pat. No. 4,023,185, have provided elements and means for rapidly recording large amounts of information in a small area in such a way that the information is read back with a high signal-to-noise ratio. These elements employ a thin recording layer of a certain metallic or organic material deposited on a support. The recording means comprises a beam of high energy-density radiation, such as a laser beam.

Usually, the laser beam is modulated, e.g., pulsed corresponding to a pattern of information, and focused onto the surface of the recording layer. The recording layer has sufficient absorbence at the wavelength of the laser beam so that the laser transfers enough energy to small portions of the layer to burn, evaporate or otherwise remove the metallic or organic material from those portions. This technique is usually referred to as ablative recording. Generally, there is continuous relative motion between the laser and the layer so that, as the laser is pulsed or modulated, discrete pits or holes of varying sizes are created in the layer. The sizes and spacings of these holes constitute the encoded information. This recorded information is usually read back by turning down the power of the writing laser or by using another laser of lower power, thereby precluding the reading laser from further physically altering the recorded layer. The reading beam, which is disposed to follow the same path as the recording beam, must also be significantly absorbed by the recording layer so that an optical density difference is detected between pits and unrecorded areas. This density difference is detected by a photodetector positioned to receive laser light reflected from the underlying support where holes have been formed in the recording layer (in the case of a reflective support) or positioned to receive laser light transmitted through the underlying support where holes have been formed in the recording layer (in the case of a transmissive support). The detected density variations are converted back into an electrical signal corresponding to the information recorded.

It is readily apparent that the designer of an ablative recording element is faced with a dilemma. While it is desirable that the recording layer have "high" absorbance during recording, a "high" absorbance during reading increases the risk of physically altering the layer, thereby damaging the recording. While turning down the power of the read laser avoids damage, this expedient usually decreases the signal-to-noise ratio of the playback. Thus, the absorbance of the recording layer for an ablative process is a compromise. The absorbance must be high enough to provide for recording using reasonable writing power, yet not so high as to result in physical damage at reasonable reading power.

Several materials have been suggested for this density-difference-type of ablative recording. Bismuth appears to be a preferred metal for such applications, and a single organic material, 4-phenylazo-1-naphthylamine, has been disclosed to be useful in U.S. Pat. No. 4,023,185. Unfortunately, all of the materials previously known to be useful in such applications are coated in layers of the desired thinness on a support only by techniques which are relatively expensive and time-consuming, such as vacuum-evaporative deposition, a method taught in U.S. Pat. No. 4,023,185 to be the only successful technique for forming a useful 4-phenylazo-1-naphthylamine layer. It is, therefore, very desirable to provide a class of materials for the recording layer which is easily coated, e.g., from a solvent, by quick and inexpensive coating methods and still provide a high-quality, high information-density recording capability.

The present invention provides a recording element, and a process for writing and reading the element, having the desirable characteristics described above.

SUMMARY OF THE INVENTION

During experimentation with various solvent-coated materials in an attempt to find some which would be useful for high-quality, high information-density, ablative recording, a mistake in the experimental procedure led to the present invention. An amorphous material was coated from a solvent onto a rigid, reflective support to form a layer thinner than the solvent-coated layers taught by the prior art, i.e., less than 0.45-micron thick. The amorphous material had extremely high absorptivity at the wavelength of an argon-ion laser (488 nanometers). An ablative recording was made in this amorphous material using the argon-ion laser. The intention was to read the recorded information by turning down the power of the argon-ion laser and detecting density variations by way of the reflected light. Instead, a helium-neon laser (wavelength: 633 nanometers) was inadvertently used to provide the reading beam. Because the amorphous material of the recording layer was virtually transparent to helium-neon-laser light, i.e., it had very low absorptivity at 633 nanometers, it would not have been expected that a reading could be made. In other words, it would have been expected that the 633-nm radiation of the read beam would reflect equally off the reflective support whether or not the laser was "looking" at an "information hole" in the recording material. Unexpectedly, even though the material was essentially transparent to this laser, good playback was made with the helium-neon-laser.

Upon close inspection of the recording surface with a scanning electron-microscope, it was found that, whether holes were created or not, depressions surrounded by sharply defined ridges were formed in the highly absorptive amorphous material. It is theorized that the good reading made with the helium-neon laser was caused, not by reading density differences as taught by the prior art, but by reading the laser-light-scattering effect of the sharp ridges; i.e., the sharp change toward "vertical" in the surface of the amorphous material at the ridges from the "horizontal" surface of the undeformed areas caused enough light-scattering or phase shift of the incident light to produce a good simulation of a density variation when a reading scan was made with the helium-neon laser. For whatever reason, by providing a recording layer having an extremely high absorption at the wavelength of the writing laser, it is possible to make a recording which is readable using a laser which is not absorbed by the recording layer. Further, not only is playback possible, but it is of high quality because it is possible to use a relatively high-power laser for reading without damaging the recorded layer.

Thus, according to an embodiment of the invention, there is provided a recording element comprising a support having thereon a recording layer of an amorphous material comprising a mixture of a dye and a binder wherein:

the amorphous material has an absorption factor of at least about 20 at a first wavelength and is substantially transparent at a second wavelength; and the amorphous material is capable of being thermally deformed by a beam of high energy-density radiation of the first wavelength to form a deformation comprising a hole or depression surrounded by a sharply defined ridge, which deformation is capable of being detected by a beam of high energy-density radiation of the second wavelength.

According to an alternate embodiment, the amorphous material of the recording layer consists essentially of the solvent-coatable dye Iosol Red.

In preferred embodiments, the dye and binder mixture are solvent-coatable. In particularly preferred embodiments, the thickness of the layer of amorphous material is less than about 0.45 micron.

In another embodiment, there is provided an information record wherein the described recording element has been recorded upon to produce the deformations which are capable of being detected using a read beam which is not absorbed by the recording layer.

In yet another embodiment, there is provided a method for writing and reading a high information-density record. The method comprises writing on the described recording element with a beam of high energy-density radiation of a first wavelength and reading the resulting information record with a beam of high energy-density radiation of a second wavelength.

By "sharply defined ridge" is meant that the ridge and hole/depression have noticeable boundaries and that, as measured in the plane of the undeformed outer surface of the layer and in the direction of relative motion, if any, between the recording beam and the layer, the width of the ridge is less than or equal to the breadth of the hole/depression. This includes the case where the ridge itself it not noticeable but the hole/depression is sharply defined.

The "absorption factor" of the amorphous material is defined as the product of the weight fraction of dye included in the amorphous material and the molar extinction coefficient of the dye at the wavelength of the recording beam of choice ($\epsilon_{80}$), divided by the molecular weight of the dye (MW), and having the units of liter per gm-cm. Where necessary, the effect of the binder on the absorption spectrum of the dye is taken into consideration in calculating the absorption factor of a dye-binder amorphous material. A procedure for this correction is described in the detailed description which follows.

A recording element in accordance with one presently preferred form of the invention is capable of being recorded upon, erased, and recorded upon again.

One useful method of producing replicates from the element of the invention is to deposit a metal layer on the deformed surface of the recorded element, strip the metal layer off, and use the stripped-off metal layer as a mold to press out or otherwise mold replicate recordings.

BRIEF DESCRIPTION OF THE DRAWINGS

FIG. 1 is a cross-sectional view of a portion of a recording element of the invention.

FIG. 2 is a cross-sectional view of the recording element of FIG. 1 after it has been recorded upon.

FIG. 3 is a cross-sectional view of a portion of a recording element which has been recorded upon and which does not fall within the definition of the invention. It is included for purposes of comparison with FIG. 2.

DESCRIPTION OF THE PREFERRED EMBODIMENTS

In the detailed description which follows, embodiments of the invention which are particularly useful in video-disc applications are described. It is understood, however, that the invention is not limited to these embodiments. For example, it is appreciated that the elements and methods of the invention are adaptable to any form of digital information storage such as computer memories. Other embodiments will be apparent to those skilled in the art.

The invention provides a recording element and process useful for high-quality, high information-density recording. "High-quality recording" as used herein is defined as a recording which when read back has a signal-to-noise ratio greater than or equal to 40 decibels and few imperfections or dropouts. "High information-density recording" as used herein is defined as a recording in which discrete bits of information are in the form of deformations having respective sizes smaller than 1.5 microns. "Size" is defined, referring to FIG. 2 of the drawings, as the sum of the dimensions R plus D plus R, i.e., the ridge width plus the depression breadth plus the ridge width, measured in the plane of the undeformed outer surface of the layer 10 and in the direction perpendicular to the direction of relative motion between a recording beam and the recording layer.

Referring to FIG. 1 of the drawings, the recording element comprises a layer 10 of amorphous material, preferably less than 0.45-micron thick, which is optionally coated from a solvent onto a support 20. Any of the widely known thin-layer solvent-coating techniques are useful, such as bar-coating, spray-coating and whirl-coating. By "solvent-coating" is meant that the dye or dye-binder mixture is dissolved in a solvent, the resulting solution coated on the support, and the solvent removed. In the case of the dye-binder mixture, either a common solvent for the dye and binder is used, or two or more miscible solvents are used.

The thickness of the amorphous layer is preferably less than 0.45 micron. While high-absorption-factor layers of conventional thickness, i.e., 1–10 microns or greater, produce excellent recordings which are readable with a nonabsorbed read beam, exceptionally thin layers provide further improvements in signal-to-noise ratio. For example, for a given amorphous material, recorded information played back from a layer less than 0.45 micron usually has a signal-to-noise ratio which is as many as 3 decibels greater than the playback from a 2-micron layer. In particularly preferred embodiments of the invention, layer 10 is less than 0.35-micron thick.

The layer 10 has a very high optical density, i.e., an absorption factor of 20 or greater at the wavelength of the recording beam of choice, in order to be able to absorb sufficient energy from the recording beam to undergo proper thermal deformation. (It will be readily appreciated that absorption factor is thickness-independent, while for a given dye-binder composition optical density is thickness-dependent. However, if the composition has an absorption factor greater than 20, even thin layers have a high density.) The layer has a glass transition temperature significantly higher than room temperature and lower than the temperature which is imparted to a point on the layer by the recording beam of choice. Otherwise, the layer is not able to retain the thermal deformation pattern after recording or is not capable of being recorded upon at all. A useful range of glass transition temperatures for the recording layer is preferably between about 40° C. and about 150° C., although higher and lower glass transition temperature materials are also useful.

The particular deformation structure which provides the high degree of radiation-scattering or phase change necessary for high-quality, high information-density recording and reading according to the invention is illustrated in FIG. 2 of the drawings. FIG. 2 shows that the ridge width R is less than or equal to the breadth D of the depression (or hole, dashed line 21) after recording. This criterion provides the basis for a practical test for identifying amorphous materials useful for the invention. A recording beam is focused on the material and then the resultant deformation is viewed, for example, through a scanning electron microscope. By using a comparative scale, the ridge width and depression breadth is measured in the plane of the undeformed surface and in the direction in which the recording beam was moved. If the ridge width is not less than or equal to the breadth of the depression (hole), or if the ridge and depression (hole) are not defined sharply enough to make such measurements, the amorphous material is not a useful one. In performing such a test, an exposure series is made; that is, the power of the recording beam or the recording time is varied so that a series of attempted recordings is made which covers a range extending from the point where no deformation occurs (low power or short exposure time) to the point where actual vaporization or burning off of the amorphous material occurs (high power or long exposure time). The measurements should then be made of the step in the exposure series which provides the most sharply defined ridge and depression, if any.

FIG. 3 is included to illustrate a situation where the amorphous material is not useful, for example, where the layer has an absorption factor less than 20. It can be seen that in this case, after recording, the ridge width R' is greater than the depression breadth D'. It will also be realized that it is difficult even to make the measurements in this case because the ridge is so ill-defined that it would be difficult to decide where the gently sloping ridge ends and the undeformed portion of the layer begins. The radiation-scattering or phase-change effect of such a gently sloping deformation is not sufficient for high-quality, high information-density recording.

In one embodiment, the amorphous material is the solvent-coatable dye, Iosol Red. In another embodiment, the amorphous material is a mixture of a binder and an absorptive material such as a dye chosen for its high extinction coefficient at the wavelength of the recording beam. The dye must be compatible with the binder. By "compatible" is meant that the dye is capable of being mixed with the binder in sufficient concentration to provide the required absorption factor without crystallizing after the layer is dried. The mixture normally comprises 1 part binder or mixture of binders by weight and 1 part dye or mixture of dyes by weight, but in some cases it is desirable to increase or decrease the proportion of binder in the mixture. In some cases, it is also useful to include a plasticizer in the mixture to achieve the desired deformation capabilities. In preferred embodiments, the amorphous material is soluble in an organic solvent such as cyclohexanone, acetone, benzene or xylene.

Useful binders are, for example, cellulose acetate butyrates, polystyrenes, polysulfonamides, Lexans (polycarbonates), cellulose nitrate, hydroabietyl alcohol (sold by the Hercules Chemical Co as Abitol ™ AUK 257), poly(ethyl methacrylate), poly(vinyl butyral) and combinations and derivatives thereof. Cellulose nitrate is the preferred binder.

A useful dye is chosen for its compatibility with the binder of choice, as discussed above, and for high absorptivity at the wavelength of the recording beam of choice. Innumerable dyes are available and well-known. When the recording beam is one produced by an argon-ion laser (wavelength=488 nm), useful dyes include but are not limited to: Iosol Red (CI solvent red 68) ($\epsilon_{488}/MW=40$); Eastone Red R (available from Eastman Kodak Company) having the structural formula:

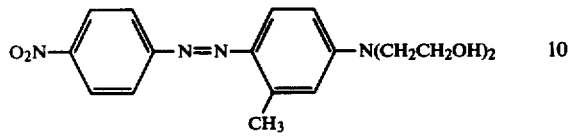

N,N—bis(2-hydroxyethyl)-3-methyl-4-(4-nitrophenyl-azo)aniline
($\epsilon_{488}/MW = 74.2$);

Eastone Red B (available from Eastman Kodak Company) having the structural formula:

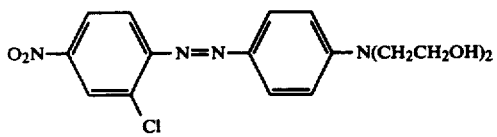

N,N—bis(2-hydroxyethyl)-4-(3-chloro-4-nitrophenyl-azo)aniline
($\epsilon_{488}/MW = 79.5$);

Sudan IV, having the structural formula:

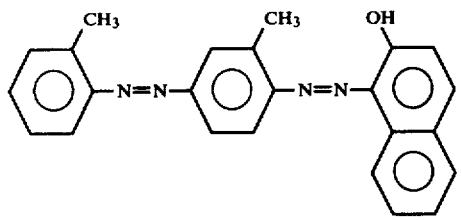

1-[4-(2-tolylazo)-2-tolylazo]-2-naphthol
($\epsilon_{488}/MW = 66$);

1-(2-pyridylazo)-2-naphthol having the structural formula:

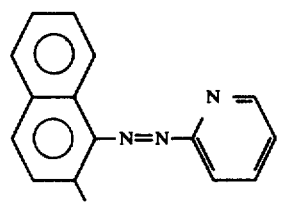

($\epsilon_{488}/MW = 62$);

a dye referred to herein as SK1 having the structural formula:

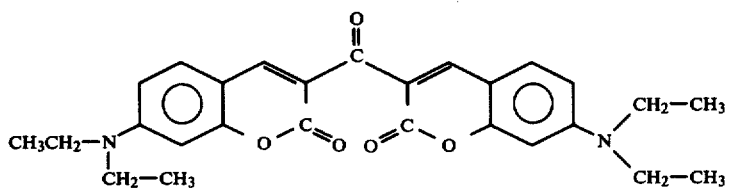

3,3'-carbonylbis(7-diethylaminocoumarin)
($\epsilon_{488}/MW = 128$); and a dye referred to herein as SK2 having the structural formula:

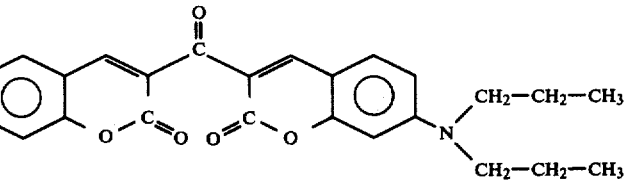

3,3'-carbonylbis(7-dipropylaminocoumarin)
($\epsilon_{488}/MW = 123$).

The preparation of compounds such as SK1 and SK2 and other useful coumarins is described in Research Disclosure, item 16167, September, 1977. Research Disclosure is published by Industrial Opportunities Ltd, Homewell, Havant, Hampshire, P09 1EF, UK.

For each of the dyes above, the $\epsilon_{488}/MW$ has been corrected for the effect of cellulose nitrate on the absorption spectrum of the dye. To do this, the extinction coefficient and absorption spectrum are determined in a solvent in the usual manner. The dye is then coated in cellulose nitrate and its absorption spectrum in a dried layer is determined. The two absorption spectra are then normalized at λmax and the correction factor is then determined as the ratio of the density at 488 nm in nitrocellulose to the density at λmax in nitrocellulose. Multiplying the $\epsilon_{\lambda max}/MW$ solvent by the correction factor gives the value for $\epsilon_{488}/MW$ for the above dyes. This corrective procedure is applicable to all dye/binder combinations.

In the examples which follow this detailed description, the value of $\epsilon_{488}/MW$ corrected for cellulose nitrate was used in all examples when calculating the absorption factor, regardless of the specific binder used. Variation in the effect of these different binders on the absorption spectrum of these dyes is expected to be minor, and it is expected that all of the examples have an absorption factor in excess of 20 when corrected for each specific binder.

If the recording element is to be used as a master record for producing replicate records, it is useful in some embodiments to incorporate into the amorphous material an additional dye having high absorbency at a wavelength of radiation useful for recording upon a replicate recording element. In such a case, the support must be substantially transparent at that wavelength.

One useful method of producing replicates from the recorded element of the invention is first to deposit a metal layer on the deformed surface of the recorded layer by a known technique such as chemical plating or vacuum deposition. The metal layer is then separated from the recorded layer such as by stripping. The resulting mold has a layer of metal which corresponds to the mirror image of the recorded layer. In other words, the metal layer has a plurality of deformations comprising a raised area (corresponding to the hole depression in the recorded layer) and, surrounding the raised area, a sharply defined recessed ridge (corresponding to the depression ridge). The mold is used to press out or otherwise mold replicate recordings (much in the same way as present-day replicate phonograph records are produced).

Referring again to FIG. 1, the support 20 is optionally rigid or flexible and transparent or reflective, depending upon the way it is to be used. The support is any of a virtually unlimited number of materials, for example, glass plate, glass plate coated with a 500 A-thick reflective layer of aluminum, a resin film or plate such as poly(ethylene terephthalate) or cellulose acetate, paper, clay, wood or metal, to name a few among many. Important characteristics of the support are that it have a relatively high melting point (to avoid deformation during recording), have a very smooth surface (to minimize noise), and be capable of being coated with a layer of amorphous material, with good adhesion and no significant chemical reactivity between the layer and the support.

In certain preferred embodiments, the support is coated with a smoothing layer prior to the coating of the reflective layer, if any, and the described recording layer. The composition which is used to form the smoothing layer is preferably a low-viscosity, polymerizable fluid which is coated on the surface of the support. Following coating, polymerization of the fluid produces a microsmooth surface on the support. The support is made reflective, for example, by vacuum metalization of the smooth surface. In preferred embodiments, the polymerizable fluid comprises photopolymerizable monomers. Preferably, the monomers are low-viscosity fluids in the absence of solvents. Useful polymerizable fluid composition are described in U.S. Pat. Nos. 4,092,173 and 4,171,979.

The support is optionally coated with other layers, as is known in the art. For example, prior to coating the recording layer, the surface of the support is coated with a spacer layer which is substantially transparent to both write and read wavelengths. Such a spacer layer preferably has a refractive index which creates an interface of low dielectric contrast with the recording layer. The use of such a spacer layer is described by A. E. Bell and F. W. Spong, IEEE *Journal of Quantum Electronics*, July, 1978, page 487.

The recording element of the present invention is useful, as previously described, to make a high-quality, high information-density recording by thermally deforming the recording layer with a writing beam, such as an electron beam or laser beam, which is pulsed in a manner corresponding to the information being recorded. In preferred embodiments, there is continuous relative motion between the surface of the recording layer and the writing beam. The rate of this relative motion (scanning speed) varies, and the recording beam power and diameter also vary. The peak power delivered to the surface of the recording layer is from 2 to 10 milliwatts in the examples provided below but is not limited to that range. The beam diameter also varies widely, being about 0.75 micron or less in the examples, but it optionally is larger or smaller, depending on the size of the deformation desired. The scanning speed also varies. In the examples, the scanning speeds used resulted in 45 to 55 nanosecond exposures per recorded bit of information.

The information optionally is read back by use of the recording beam, with its power, of course, reduced sufficiently so as not to cause any further thermal deformation. The high-absorption-factor layers described herein provide for high-quality recordings even using a read beam which is absorbed by the recording layer. However, the preferred reading beam is not absorbed to any extent by the amorphous layer of material. Thus, the reading beam optionally is of a much higher power than would be the case if the read beam were absorbed by the layer. Where the power of the reading beam is high, the signal-to-noise ratio of the playback is also high, usually well above 40 decibels. Schlieren optics are useful during reading but are not required. Reading is preferably accomplished by establishing continuous relative motion between the surface of the recorded layer of the information record and a continuous reading beam. The reading beam cooperates with a detector which detects the spacings between deformations.

In some embodiments of the invention, as previously mentioned, the recorded information is erased by heating the whole surface of the recorded element, for example, with a hot airstream, until surface tension smooths out the surface, or by following techniques such as those described in U.S. Pat. No. 3,475,760. The element is capable of being recorded upon again. This cycle is repeatable a large number of times, depending upon whether any significant portion of the amorphous material has been lost or damaged becaue of vaporization, burning or dye bleaching during recording. A recording element having a recording layer less than 0.45-micron thick, comprising a 3-to-1 mixture by weight of Iosol Red and cellulose nitrate, is a good example of a recording element which is erasable and rerecordable.

Optimization of the recording elements of the present invention is described in a commonly assigned application entitled PHYSICALLY OPTIMIZED OPTICAL DISC STRUCTURE, METHOD AND APPARATUS filed Feb. 25, 1980, Ser. No. 124,381, in the names of Howe and Wrobel. Particularly preferred dye-binder amorphous compositions for the recording layer are described in a commonly assigned application entitled α, α'-BIS(DIALKYLAMINOBENZYLIDENE) KETONE DYES AND THEIR USE IN OPTICAL RECORDING ELEMENTS filed Feb. 25, 1980, Ser. No. 124,382, in the names of Specht and Thomas. Thermal and mechanical barrier layers and various overcoats for the recording elements of the present invention are described in a commonly assigned application entitled THERMAL AND MECHANICAL BARRIER LAYERS FOR OPTICAL RECORDING ELEMENTS filed June 18, 1980, in the names of Hollister and Thomas. Preferred disc configurations are described in a commonly assigned application entitled IMPROVED OPTICAL DISC METHOD, MEDIA AND APPARATUS FOR WRITING AND/OR READING INFORMATION, filed June 18, 1980, in the names of Geyer and Howe.

The following examples are provided further to illustrate preferred embodiments of the invention.

EXAMPLE 1

A mixture of 1.0 g of SK1 (defined previously) and 1.0 g of cellulose nitrate was dissolved in 120 g of cyclohexanone, filtered through a filter having a pore size of 0.45 micron, and whirlcoated at 200 rpm onto a circular glass plate having a diameter of about 110 mm and a 500 A-thick layer of aluminum on the surface being coated. The resultant dried layer of amorphous material had a thickness of approximately 0.16 micron and an absorption factor of 64 at 488 nm.

Information was recorded upon the resulting element using a modulated (i.e., pulsed) argon-ion laser (wavelength=488 nm) having a beam diameter of about 0.7 micron. Each discrete bit of information was recorded as a deformation (a depression surrounded by a sharply defined ridge) having a size smaller than 1.5 microns. The information was read back using a helium-neon laser (wavelength=633 nm) and yielded a signal having a signal-to-noise ratio of 52 decibels with few imperfections or dropouts.

EXAMPLE 2

A mixture of 0.5 g of the dye SK1 and 1.0 g of cellulose nitrate was dissolved in 60 g of cyclohexanone, filtered through a filter having a pore size of 0.45 micron, and whirl-coated at 400 rpm onto an aluminized glass plate as in Example 1, to a thickness of about 0.16 micron and an absorption factor at 488 nm of about 43.

Information from a color video signal was recorded upon the resulting element using the argon-ion laser. Each discrete bit of information was recorded as a deformation (a depression surrounded by a sharply defined ridge) having a size smaller than 1.5 microns. The information was read back using the helium-neon laser, and yielded a signal-to-noise ratio of 54 decibels with few imperfections or dropouts.

EXAMPLE 3

A mixture of 3.0 g of Iosol Red dye and 1.0 g of cellulose nitrate was dissolved in 80 g of cyclohexanone, filtered to 0.45 micron absolute, and whirl-coated, at 1050 rpm onto an aluminized glass plate as in Example 1, to a thickness of less than 0.45 micron and an absorption factor at 488 nm of 30.

Information corresponding to a color video signal was recorded upon the resulting element using the argon-ion laser. Each discrete bit of information was recorded as a deformation (a depression surrounded by a sharply defined ridge) having a size smaller than 1.5 microns. The information was read back using the helium-neon laser, and yielded a signal-to-noise ratio of 48 dB with few imperfections or dropouts. This recording was erased with heat and rerecorded, the cycle being repeated three times with equal performance.

EXAMPLE 4

A mixture of 1.0 g of the dye SK1 and 1.0 g of Abitol TM AUK 257 was dissolved in 50 g of cyclohexanone, and whirl-coated as in Example 3. The resulting layer had an absorption factor of 64.

Color video signal information was recorded upon the resulting element using the argon-ion laser. Each discrete bit of information was recorded as a deformation (a depression surrounded by a sharply defined ridge) having a size smaller than 1.5 microns. The information was read back using the helium-neon laser, and yielded a signal-to-noise ratio of 48 dB with few imperfections or dropouts. This recording was erased with heat and rerecorded with good performance.

EXAMPLE 5

A number of amorphous materials were prepared, coated and recorded upon as in the previous examples. Recording power ranged from about 2 to 10 milliwatts at a beam diameter of about 0.7 micron. The specific materials and their performances are listed in Table 1. All of these materials were chosen for their capability of being thermally deformed to form depressions surrounded by sharply defined ridges.

TABLE 1

| Performance of Various Amorphous Recording Materials | | | | |
|---|---|---|---|---|
| Dye | Binder | Wt Ratio of Dye to Binder | Absorption Factor | Performance S/N Ratio in dB) |
| Eastone Red R | cellulose acetate butyrate | 1:1 | 37 | 43 |
| Eastone Red R | cellulose nitrate | 1:1 | 37 | 50 |
| SK1 | Abitol TM | 1:1 | 64 | 48 (erasable and rerecordable) |
| SK1 | poly(ethyl methacrylate) | 1:1 | 64 | 42–46 |
| SK1 | cellulose nitrate | 1:2 | 43 | 54 |
| SK1 | cellulose nitrate | 1:3 | 32 | 46 |
| SK1 | cellulose nitrate | 1:4 | 21 | 43 |
| SK1 | Abitol + cellulose nitrate | 1:1:1 | 43 | 43 |
| SK1 | Abitol + cellulose nitrate | 2:1:1 | 64 | 50 |
| Sudan IV | cellulose nitrate | 1:1 | 33 | 45 |
| 1-(2-pyridyl-azo)-2-naphthol | cellulose nitrate | 1:1 | 31 | 47 |
| Eastone Red R | poly(vinyl butyral) | 1:1 | 37 | 44 |
| SK2 | polystyrene (MW9000) | 1:1 | 62 | 43 |
| Iosol Red | none | 1:0 | 40 | 48 (self-erases with time at room temp) |
| Iosol Red | cellulose nitrate | 1:1 | 20 | 48 |
| Iosol Red | cellulose nitrate | 3:1 | 30 | 48 (erasable and rerecordable) |
| Eastone Red B | cellulose nitrate | 1:1 | 40 | 50 |

In order to compare the present invention with the disclosure of Belgian Pat. No. 858,636, several experimental recording elements were prepared. These experiments are reported in the following comparative examples.

COMPARATIVE EXAMPLE 1

A coating composition according to Example 1 of Belgian Pat. No. 858,636 was prepared by dissolving 20 mg of Solvent Red 1 dye in 10 ml of a 10% weight (g) per volume (ml) solution of PARLON ™ 300 Cp in 1,1,2-trichloroethylene. This coating composition was 2% by weight of dye with respect to the thermoplastic polymer. It was whirl-coated onto a 110-mm-diameter aluminized glass plate and dried at 25° C. to obtain a recording layer having a specular optical density of 0.37. The absorption factor of the coating at 488 nm was only 3.

It was not possible to record a color video signal on this recording layer using the recording procedure described in Example 5, above.

This experiment shows that the recording layer according to this invention must have an absorption factor, as hereinbefore defined, of 20 or greater to produce a satisfactory, high-quality recording.

COMPARATIVE EXAMPLE 2

A coating composition was prepared by dissolving 0.1 g of the dye SK1 in 10 ml of a 9% by weight solution of Paclon CP in cyclohexanone. This is the maximum permissible ratio of dye to polymer according to Belgian Pat. No. 858,636. This solution was whirl-coated onto a 110-mm-diameter, aluminized glass plate to give a specular density of 0.88. The absorption factor of the recording layer was 13 at 488 nm.

An attempt was made to record a color video signal on this element using the procedure described in Example 5. On microscopic examination, it was noted that slight deformations had been formed in the recording layer, but it was impossible to obtain a usable picture on playback.

This experiment shows that employing a useful dye (see Examples 1, 2, 4 and 5) at only 10% by weight based on the thermoplastic polymer results in a recording layer having a low absorption factor which is not satisfactory for the purposes of this invention.

COMPARATIVE EXAMPLE 3

A coating composition was prepared by dissolving 0.1 g of the dye SK1 and 1 g of cellulose nitrate in 100 g of cyclohexanone. The solution was filtered as in Example 1 and whirl-coated on a 110-mm aluminized glass disk at a specular density of 0.88. The absorption factor of the recording layer was 13 at 488 nm and the layer thickness was 0.75 micron.

It was not possible to record a color video signal on this element using the recording procedure described in Example 5; i.e., the detected signal-to-noise ratio on playback was less then 20 dB.

A second recording material was prepared with this coating composition at at thickness of 0.15 micron. This recording layer had a specular density of 0.18 and was not capable of recording a color video signal by the procedure described in Example 5. This experiment shows that an absorption factor of 20 or greater is necessary for a satisfactory recording.

The invention has been described with reference to particular preferred embodiments thereof, but it will be recognized that variations and modifications can be effected within the spirit and scope of the invention.

We claim:

1. A recording element comprising a support having thereon a recording layer of an amorphous material having a signal-to-noise ratio of at least 40 decibels and comprising a mixture of a dye and a binder wherein:
    (a) said amorphous material has an absorption factor of at least about 20 at a first wavelength and is substantially transparent at a second wavelength wherein the absorption factor is a product of the weight fraction of dye included in the amorphous material and the molar extinction coefficient of the dye at the wavelength of a recording beam of choice ($\epsilon_\lambda$), divided by the molecular weight of the dye (MW), and having the units of liter per gm-cm;
    (b) said amorphous material is capable of being thermally deformed by a beam of high energy-density radiation of said first wavelength to form a deformation comprising a hole or depression surrounded by a sharply defined ridge, wherein the width of the ridge is less than or equal to the breadth of the hole or depression, as measured in the plane of the undeformed outer surface of the layer and in the direction of the relative motion, if any, between the recording beam and the layer, which deformation represents encoded information capable of being detected by a beam of high energy-density radiation of said second wavelength.

2. A recording element according to claim 1 wherein said layer of amorphous material has a thickness of less than 0.45 micron.

3. A recording element according to claim 1 wherein said amorphous material is organic solvent-soluble.

4. A recording element according to claim 1 wherein said support is a reflecting support.

5. A recording element according to claim 1 wherein said support is a reflecting support and is coated on both sides with a layer of said amorphous material.

6. A recording element according to claim 1 wherein said support is substantially transparent to radiation of said second wavelength.

7. A recording element according to claim 1 wherein:
    (a) said dye is selected from the group consisting of:
        (i) Iosol Red;
        (ii) N,N-bis(2-hydroxyethyl)-3-methyl-4-(4-nitrophenylazo)aniline;
        (iii) N,N-bis(2-hydroxyethyl)-4-(3-chloro-4-nitrophenylazo)aniline;
        (iv) 1-[4-(2-tolylazo)-2-tolylazo]-2-naphthol;
        (v) 1-(2-pyridylazo)-2-naphthol;
        (vi) 3,3'-carbonylbis(7-diethylaminocoumarin); and
        (vii) 3,3'-carbonylbis(7-dipropylaminocoumarin); and
    (b) said binder is selected from the group consisting of cellulose acetate butyrate, polystyrene, polysulfonamide, polycarbonate, cellulose nitrate, hydroabietyl alcohol, poly(ethyl methacrylate) and poly(vinyl butyral).

8. A recording element according to claim 1 wherein said binder is cellulose nitrate.

9. A recording element according to claim 1 wherein said recording layer is capable of being recorded upon, erased by overall heating, and recorded upon again.

10. A recording element according to claim 1 wherein said mixture of a dye and a binder is selected from the group consisting of:

15

(a) 1 part by weight of 3,3'-carbonylbis(7-diethylaminocoumarin) and 1 part by weight of hydroabietyl alcohol and (b) 3 parts by weight of Iosol Red and 1 part by weight of cellulose nitrate.

11. A recording element according to claim 1 wherein said support is a metal.

12. A recording element comprising a support having thereon a recording layer of an amorphous material having a signal-to-noise ratio of at least 40 decibels and comprising a mixture of a dye and a binder wherein:

(a) said amorphous material has an absorption factor of at least about 20 at a first wavelength and is substantially transparent at a second wavelength wherein the absorption factor is a product of the weight fraction of dye included in the amorphous material and the molar extinction coefficient of the dye at the wavelength of a recording beam of choice ($\epsilon_\lambda$), divided by the molecular weight of the dye (MW), and having the units of liter per gm-cm;

(b) said layer of amorphous material has a thickness less than 0.45 micron, (c) said amorphous material is organic solvent-soluble, and (d) said amorphous material is capable of being thermally deformed by a beam of high energy-density radiation of said first wavelength to form a deformation comprising a hole or depression surrounded by a sharply defined ridge, wherein the width of the ridge is less than or equal to the breadth of the hole or depression, as measured in the plane of the undeformed outer surface of the layer and in the direction of the relative motion, if any, between the recording beam and the layer, which deformation represents encoded information capable of being detected by a beam of high energy-density radiation of said second wavelength.

13. A recording element according to claim 12 wherein said support is a reflecting support.

14. An information record according to claim 12 wherein said layer of amorphous material is less than 0.45 micron thick.

15. An information record according to claim 12 wherein said amorphous material is organic solvent-soluble.

16. An information record according to claim 12 wherein said support is a reflecting support.

17. An information record according to claim 12 wherein said support is a reflecting support and is coated on both sides with a recorded layer.

18. An information record according to claim 12 wherein said support is substantially transparent to radiation of said second wavelength.

19. An information record according to claim 12 wherein said binder is cellulose nitrate.

20. An information record according to claim 12 wherein said recorded layer is capable of being erased by overall heating and recorded upon again.

21. An information record according to claim 12 wherein said mixture of a dye and a binder is selected from the group consisting of:

(a) 1 part by weight of 3,3'-carbonylbis(7-diethylaminocoumarin) and 1 part by weight of hydroabietyl alcohol and (b) 3 parts by weight of Iosol Red and 1 part by weight of cellulose nitrate.

16

22. An information record comprising a support having thereon a recorded layer of an amorphous material having a signal-to-noise ratio of at least 40 decibels and comprising a mixture of a dye and a binder wherein:

(a) said amorphous material has an absorption factor of at least about 20 at a first wavelength and is substantially transparent at a second wavelength wherein the absorption factor is a product of the weight fraction of dye included in the amorphous material and the molar extinction coefficient of the dye at the wavelength of a recording beam of choice ($\epsilon_\lambda$), divided by the molecular weight of the dye (MW), and having the units of liter per gm-cm;

(b) said recorded layer has a plurality of deformations having a size smaller than 1.5 microns, said deformations comprising a hole or depression surrounded by a sharply defined ridge wherein the width of the ridge is less than or equal to the breadth of the hole or depression, as measured in the plane of the undeformed outer surface of the layer and in the direction of the relative motion, if any, between the recording beam and the layer, which deformation represents encoded information capable of being detected by a beam of high energy-density radiation of said second wavelength.

23. An information record according to claim 22 wherein the support is a metal.

24. A method for writing and reading a high information-density record, said method comprising the steps of:

(a) writing said high information-density record on a recording element with a writing beam of high-energy-density radiation of a first wavelength, said recording element comprising a support having thereon a recording layer of an amorphous material having a signal-to-noise ratio of at least 40 decibels and comprising a mixture of a dye and a binder or consisting essentially of the dye Iosol Red, wherein:

(i) said amorphous material has an absorption factor of at least about 20 at a first wavelength and is substantially transparent at a second wavelength wherein the absorption factor is a product of the weight fraction of dye included in the amorphous material and the molar extinction coefficient of the dye at the wavelength of a recording beam of choice ($\epsilon_\lambda$), divided by the molecular weight of the dye (MW), and having the units of liter per gm-cm;

(ii) said writing beam produces a recorded layer comprising encoded information in the form of a plurality of deformations in said recording layer, said deformations comprising a hole or depression surrounded by a sharply defined ridge wherein the width of the ridge is less than or equal to the breadth of the hole or depression, as measured in the plane of the undeformed outer surface of the layer and in the direction of the relative motion, if any, between the recording beam and the layer; and (b) reading the resulting high information-density record with a reading beam of high-energy-density radiation of said second wavelength.

25. The method according to claim 24 wherein said writing step is accomplished by establishing continuous relative motion between the surface of the recording layer and the writing beam and pulsing the writing beam in a manner corresponding to the information being recorded.

26. The method according to claim 24 wherein said reading step is accomplished by establishing continuous relative motion between the surface of said recorded layer and a continuous reading beam and detecting the spacings between said deformations.

27. A mold for use in the production of a replicate information record having a signal-to-noise ratio of at least 40 decibels and an absorption factor of at least about 20 at a first wavelength and is substantially transparent at a second wavelength wherein the absorption factor is a product of the weight fraction of dye included in the amorphous material and the molar extinction coefficient of the dye at the wavelength of a recording beam of choice ($\epsilon_\lambda$), divided by the molecular weight of the dye (MW), and having the units of liter per gm/cm, said mold comprising a metal layer containing a plurality of deformations having a size smaller than 1.5 microns, said deformations comprising a raised area surrounded by a sharply defined recessed ridge wherein the width of the ridge is less than or equal to the breadth of the hole/depression, as measured in the plane of the undeformed outer surface of the layer and in the direction of the relative motion, if any, between a recording beam and the layer which deformation represents encoded information capable of being detected by a beam of high energy-density radiation of said second wavelength.

28. A method of forming a recording element having a signal-to-noise ratio of at least 40 decibels and comprising the step of coating a support with a recording layer of an amorphous material comprising a mixture of a dye and a binder wherein:
   (a) said amorphous material has an absorption factor of at least about 20 at a first wavelength and is substantially transparent at a second wavelength wherein the absorption factor is a product of the weight fraction of dye included in the amorphous material and the molar extinction coefficient of the dye at the wavelength of a recording beam of choice ($\epsilon_\lambda$), divided by the molecular weight of the dye (MW), and having the units of liter per gm-cm;
   (b) said amorphous material is capable of being thermally deformed by a beam of high energy-density radiation of said first wavelength to form a deformation comprising a hole or depression surrounded by a sharply defined ridge, wherein the width of the rigde is less than or equal to the breadth of the hole or depression, as measured in the plane of the undeformed outer surface of the layer and in the direction of the relative motion, if any, between the recording beam and the layer, which deformation represents encoded information capable of being detected by a beam of high energy-density radiation of said second wavelength.

29. A recording element comprising a support having thereon a recording layer of an amorphous material having a signal-to-noise ratio of at least 40 decibels and consisting essentially of the dye Iosol Red wherein:
   (a) said amorphous material has an absorption factor of at least about 20 at a first wavelength and is substantially transparent at a second wavelength wherein the absorption factor is a product of the weight fraction of dye included in the amorphous material and the molar extinction coefficient of the dye at the wavelength of a recording beam of choice ($\epsilon_\lambda$), divided by the molecular weight of the dye (MW), and having the units of liter per gm-cm;
   (b) said amorphous material is capable of being thermally deformed by a beam of high energy-density radiation of said first wavelength to form a deformation comprising a hole or depression surrounded by a sharply defined ridge, wherein the width of the ridge is less than or equal to the breadth of the hole or depression, as measured in the plane of the undeformed outer surface of the layer and in the direction of the relative motion, if any, between the recording beam and the layer, which deformation represents encoded information capable of being detected by a beam of high energy-density radiation of said second wavelength.

30. An information record comprising a support having thereon a recording layer of an amorphous material having a signal-to-noise ratio of at least 40 decibels and consisting essentially of the dye Iosol Red wherein:
   (a) said amorphous material has an absorption factor of at least about 20 at a first wavelength and is substantially transparent at a second wavelength wherein the absorption factor is a product of the weight fraction of dye included in the amorphous material and the molar extinction coefficient of the dye at the wavelength of a recording beam of choice ($\epsilon_\lambda$), divided by the molecular weight of the dye (MW), and having the units of liter per gm-cm;
   (b) said amorphous material is capable of being thermally deformed by a beam of high energy-density radiation of said first wavelength to form a deformation comprising a hole or depression surrounded by a sharply defined ridge, wherein the width of the ridge is less than or equal to the breadth of the hole or depression, as measured in the plane of the underformed outer surface of the layer and in the direction of the relative motion, if any, between the recording beam and the layer, which deformation represents encoded information capable of being detected by a beam of high energy-density radiation of said second wavelength.

* * * * *